United States Patent [19]

Varanasi et al.

[11] Patent Number: 5,646,950
[45] Date of Patent: Jul. 8, 1997

[54] MATCHED SPECTRAL NULL CODES FOR PARTIAL RESPONSE CHANNELS

[75] Inventors: Chandra C. Varanasi, Simi Valley; Nersi Nazari, Scotts Valley, both of Calif.

[73] Assignee: Seagate Technology, Inc., Scotts Valley, Calif.

[21] Appl. No.: 342,229

[22] Filed: Nov. 18, 1994

[51] Int. Cl.$^6$ .............................. G06F 11/10; H03M 13/12
[52] U.S. Cl. ........................................................ 371/43
[58] Field of Search .............................. 371/43, 30, 44, 371/45; 341/51, 59; 360/51

[56] References Cited

U.S. PATENT DOCUMENTS

| | | | |
|---|---|---|---|
| 4,115,768 | 9/1978 | Eggenberger et al. | 341/59 |
| 4,413,251 | 11/1983 | Adler et al. | 341/59 |
| 4,451,819 | 5/1984 | Beckenhauer | 341/59 |
| 4,463,344 | 7/1984 | Adler et al. | 341/51 |
| 4,538,189 | 8/1985 | Fitzpatrick | 360/40 |
| 4,581,601 | 4/1986 | Calderbank et al. | 341/95 |
| 4,583,078 | 4/1986 | Shenoy et al. | 341/51 |
| 4,888,775 | 12/1989 | Karabed et al. | 371/43 |
| 4,888,779 | 12/1989 | Karabed et al. | 371/43 |
| 4,970,609 | 11/1990 | Cunningham et al. | 360/51 |
| 5,095,484 | 3/1992 | Karabed et al. | 371/30 |
| 5,274,510 | 12/1993 | Sugita et al. | 360/49 |
| 5,280,489 | 1/1994 | Fredrickson et al. | 371/45 |
| 5,327,440 | 7/1994 | Fredrickson et al. | 371/43 |
| 5,331,320 | 7/1994 | Cidecyian et al. | 341/56 |

OTHER PUBLICATIONS

Filho et al., "Convolutional Codes for the High Density (1–D) (1+D)^n Magnetic Recording Channel", IEEE Aug. 1994.

0018–9448/91/0500–0818 1991 IEEE—Razmik Karabed & Paul Siegel Matched Spectral–Null Codes for Partial–Response Channels.

*Primary Examiner*—Reba I. Elmore
*Assistant Examiner*—Emmanuel L. Moise
*Attorney, Agent, or Firm*—Kelly Bauersfeld Lowry & Kelley, LLP

[57] ABSTRACT

A method is provided for encoding and decoding binary data, using a non-quasicatastrophic and phase invariant matched spectral null code for a partial response channel. The method is particularly suited for partial response systems wherein the order of the higher order null in the transfer function of the partial response channel is $\geq 1$, resulting in signal-to-noise (SNR) gain at the channel output. In a preferred form, the method is used to develop a rate 3/10 Nyquist-null trellis code.

8 Claims, 5 Drawing Sheets

The Sets of 10-bit Code Words for the Rate-8/10 Code Represented by
Their Decimal Equivalents A = {13, 16, 19, 25, 28, 31, 49, 52, 55, 61,64, 67, 73, 76, 79, 97,
100, 103, 109, 112,115, 121, 124, 193, 196, 199, 205, 208, 211, 217,220
223, 241, 244, 247, 253, 259, 265, 268, 271,289, 292, 295, 301, 304, 307
313, 316, 319, 385,388, 391, 397, 400, 403, 409, 412, 415, 433, 436,439,
445, 451, 457, 460, 463, 481, 484, 487, 493,496, 499, 505, 508, 769, 772,
775, 781, 784, 787,793, 796, 799, 817, 820, 823, 829, 832, 835, 841,844
847, 865, 868, 871, 877, 880, 883, 889, 892,895, 961, 964, 967, 973, 973, 976,
979, 985, 988, 991,1009, 1012,1015};

The Encoder Finite Machine for the Rate-8/10 Code

| Current State | User Word Decimal 8/10 Code | Next State | Code Word Belongs To |
|---|---|---|---|
| 1 | 0 – 112 | 2 | A |
| | 113 – 155 | | B |
| | 156 – 255 | 3 | D |
| 2 | 0 – 112 | 3 | A |
| | 113 – 155 | | C |
| | 156 – 245 | 4 | $\overline{E}$ |
| | 246 – 255 | | $\overline{F}$ |
| 3 | 0 – 112 | 4 | $\overline{A}$ |
| | 113 – 155 | | $\overline{B}$ |
| | 156 – 255 | 1 | $\overline{D}$ |
| 4 | 0 – 112 | 1 | $\overline{A}$ |
| | 113 – 155 | | $\overline{C}$ |
| | 156 – 245 | 2 | E |
| | 246 – 255 | | F |

FIG. 15

The Decoder Table for the Rate-8/10 Code

| If code word Belongs To | User Word Decimal 8/10 Code |
|---|---|
| A or $\overline{A}$ | 0 – 112 |
| B or $\overline{B}$ | 113 – 155 |
| C or $\overline{C}$ | 113 – 155 |
| D or $\overline{D}$ | 156 – 245 |
| E or $\overline{E}$ | 156 – 245 |
| F or $\overline{F}$ | 246 – 255 |

FIG. 16

MATCHED SPECTRAL NULL CODES FOR PARTIAL RESPONSE CHANNELS

BACKGROUND OF THE INVENTION

This invention relates generally to encoding and decoding of binary data transmitted over partial response channels using maximum likelihood sequence detection (PRML). More particularly, this invention relates to a method for developing a non-quasicatastrophic and phase invariant matched spectral null trellis code having a preselected code rate, wherein the order of the higher order null in the transfer function of the partial response channel is $\geq 1$.

Methods for encoding binary data for recordation on storage media such as a computer disk, and for subsequent decoding of retrieved data are generally known in the art. In this regard, data coding and decoding methods have been developed with a view toward maximizing data storage density and media storage capacity while permitting rapid data storage and subsequent retrieval at a minimum error rate. Such methods have included matched spectral null codes of the so-called trellis type, designed for use in a partial response system having a transfer function of the form $(1-D)(1+D)^n$, identified typically as the dicode, PR4, EPR4 and $E^2$PR4 channels for n=0, 1, 2 and 3, respectively. Matched spectral null codes of this type are known in theory to provide signal-to-noise (SNR) gain in the course of data storage and retrieval.

Matched spectral null trellis codes including background theory related thereto are described in more detail in Karabed and Siegel, *Matched Spectral-Null Codes For Partial-Response Channels*, IEEE Transactions On Information Theory, Vol. 37, No. 3, p. 818 (May 1991), which is incorporated by reference herein. See also U.S. Pat. Nos. 4,888,775; 4,888,779 and 5,095,484.

Despite the discussion of such trellis codes in the printed literature, and the theoretical benefits which would arise from their use, matched spectral null codes which are both phase invariant and non-quasicatastrophic and also match the higher order null of a partial response system with $n \geq 2$, have not been developed. In this regard, it is known that the data recording density increases in direct proportion to the value of (n), and hence it is desirable to utilize the higher order channels where n=2 and n=3. Mowever, to date, these trellis codes have been limited to partial response systems, for n=0, and for n=1, such that it has not been possible in actual practice to take maximum advantage of the higher order channels.

The present invention is specifically directed to overcoming this problem, by providing a matched spectral null trellis code which can be used on higher order partial response systems, i.e., n=2 and n=3.

SUMMARY OF THE INVENTION

In accordance with the invention, a method is provided for developing a matched spectral null trellis code which is non-quasicatastrophic and phase invariant, and wherein the order of the higher order null in the transfer function of the partial response channel is $\geq 1$. The generated trellis code can be used to encode strings of binary data in accordance with a preselected and advantageous code rate to achieve higher storage density or signal-to-noise (SNR) gain. The encoded data can be decoded in simple manner and with a high degree of accuracy by use of a modified Viterbi decoder.

The encoding method includes selection of a data word length for subdividing a stream of binary data into a succession of data words of uniform length, and selecting a code word length to which each data word is to be translated. For example, in a preferred form of the invention, a stream or string of binary data is subdivided into data words having eight bits, and these data words are translated to code words having ten bits. A high code rate, i.e., Rate (R)=8/10, is preferred for optimum use of channel band width.

An encoding table is developed for translating each data word to a unique code word, using a canonical state diagram (G) for binary sequences having spectral nulls at the Nyquist frequency. To achieve desirable phase invariance and non-quasicatastrophic characteristics, the encoding table is developed according to the following rules:

1. For each code word selected, the complement thereof is also selected.
2. Each code word and its complement will decode to the same data word.
3. If a code word selected from the canonical state diagrams (G) and ($G^P$) forms a loop in (G) and ($G^P$), then it corresponds with a loop that is not quasi-catastrophic in G, wherein the the power diagram $G^P$ of the diagram G is a function of code word length.

The resultant trellis code can then be used to encode a string of data words (e.g., eight bit data words) to unique string of code words (e.g., ten bit code words) that can be transmitted on the partial response channels for n=1, n=2 or n=3, if desired. The string of code words can be re-converted to re-create the original data by use of a finite memory Viterbi sequence detection device and method, together with a block decoder which decodes each specific code word and its complement to the same data word.

Other features and advantages of the present invention will become more apparent from the following detailed description, taken in conjunction with the accompanying drawings which illustrate the invention.

BRIEF DESCRIPTION OF THE DRAWINGS

The accompanying drawings illustrate the invention. In such drawings:

FIG. 14 is a tabulation of 10-bit code words for the rate 8/10 trellis code, represented by decimal equivalents;

FIG. 15 is a table representing operation of a finite state machine encoder in accordance with the code word tabulation of FIG. 14; and FIG. 16 is a decoder table to decode the sequences of 10-bit code words.

DETAILED DESCRIPTION OF THE PREFERRED EMBODIMENTS

The present invention pertains to an improved method of encoding and decoding binary data, and to the resultant matched spectral null code developed therefrom. The invention is particularly adapted for use in partial response systems having a transfer function of the form $(1-D)(1+D)^n$, identified typically as the PR4, EPR4 and $E^2$PR4 channels for n=1, 2 and 3, respectively. The method of the invention provides a matched spectral null code of the trellis type which is phase invariant and non-quasicatastrophic, and which can be used at the higher orders of the partial response system, i.e., n=2 and n=3, thereby permitting either increased recording density or a favorable signal-to-noise (SNR) gain.

Figure 1:
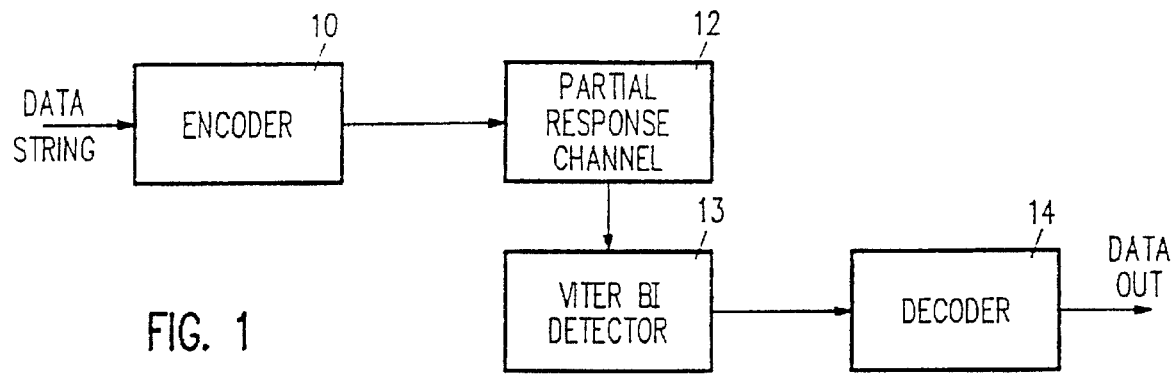
FIG. 1 is a block diagram of a partial response recording system adapted to utilize a trellis code developed in accordance with the invention.

FIG. 1 generally illustrates the encoding of a string of binary data at a preselected code rate for recordation of the data as a succession of code words of the fixed length. In a typical application, the encoder 10 translates each successive string of data bits of preselected length into a unique code word consisting of a greater number of bits for recordation on the appropriate storage media, as represented by the partial response channel 12. For example, in a preferred form, the incoming data is subdivided into a succession of data words of 8-bit length, and each data word is translated by the encoder 10 to a code word of 10-bit length, thus providing a code rate $(R)=8/10$. It will be understood, however, that other preselected and fixed code rates can be followed, e.g., $(R)=3/4$, $6/8$, etc. Moreover, it will be understood that the method may be applied to any application requiring data encoding in a partial response system and is not limited to data storage on magnetic storage media, or the like. The encoded data, or code words, can be re-converted or decoded to the original data sequence by a decoder 14 after detection by a modified finite memory Viterbi sequence detection device 13.

Matched spectral null trellis codes and related background theory are described in the literature, e.g., Karabed and Siegel, *Matched Spectral-Null Codes For Partial-Response Channels*, IEEE Transactions On Information Theory, Vol. 37, No. 3, p. 818 (May 1991), which is incorporated by reference herein. See also U.S. Pat. Nos. 4,888,775; 4,888, 779; and 5,095,484. The trellis codes discussed in these references have not been adapted to match the higher order null, referred to as the Nyquist null, and thus have not been applicable to the higher order partial response systems. The present invention provides a method and resultant code which does match the higher order Nyquist null and thus can be used with the higher order channels where n=2 and n=3.

Sequences with Spectral Nulls at DC/Nyquist Frequency

For any random sequence of binary data $\{b_n\}$ with a sampling frequency $(f_s)$, the average power spectral power density $S(f)$ is given by the following equation:

$$S(f) = \lim_{N \to \infty} E\left( \left| \frac{1}{N} \sum_{n=0}^{N} b_n D^n \right|^2 \right) \quad (1)$$

where E is the statistical average, N is the number of binary data bits in the binary string, $b_n = 1, -1 \ldots$, and D is a frequency term:

$$D = e^{-j2\pi fT} \text{ and } T = 1/g_s. \quad (2)$$

From equation (1), the following two equations can be written for f=0 (dc frequency), and for $f_N$ (Nyquist frequency)=$f_s/2$:

$$S(0) = \lim_{N \to \infty} E\left( \left| \frac{1}{N} \sum_{n=0}^{N} b_n \right|^2 \right) \quad (3)$$

$$S(f_N) = \lim_{N \to \infty} E\left( \left| \frac{1}{N} \sum_{n=0}^{N} b_n (-1)^n \right|^2 \right) \quad (4)$$

Assume that for a sequence $\{b_n\}$, for all N, the following inequality is satisfied for some constant k:

$$\left| \sum_{n=0}^{N} b_n \right| \leq k \quad (5)$$

It then follows from (Eq. 3) that for such a sequence $S(0)=0$. In other words, if the running sum of a sequence $\{b_n\}$ is bounded, then that sequence has a null at dc in its power spectrum.

Now, assume that for a sequence $\{b_n\}$ for all N, the following inequality is satisfied for some constant m:

$$\left| \sum_{n=0}^{N} b_n (-1)^n \right| \leq m \quad (6)$$

It then follows from (Eq. 4) that for such a sequence $S(f_N)=0$. In other words, if the difference between the running sum of the even-indexed terms and the running sum of the odd-indexed terms of $\{b_n\}$ is bounded, then $\{b_n\}$ has a null at Nyquist frequency in its power spectrum.

Graphic Representation of Spectral-Null Sequences

Figure 2:
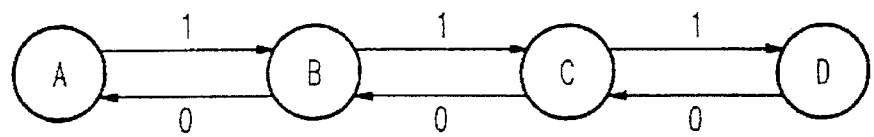
FIG. 2 is an illustrative canonical state diagram for binary sequences having a spectral null at zero frequency.
Figure 3:
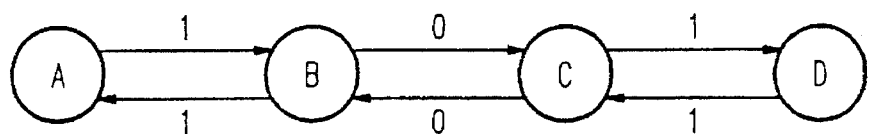
FIG. 3 is an illustrative canonical state diagram for binary sequences having a spectral null at Nyquist frequency.

Binary sequences with spectral null constraints are normally characterized by so-called canonical state diagrams or graphs, as represented by way of example in FIGS. 2 and 3. In developing the canonical diagram for a sequence of symbols $\{b_n\}$, with a mapping rule using binary code symbols $\{1, 0\}$ for modulation symbols 1 and -1, the graph used to generate binary sequences with a spectral null at dc (f=0) is shown in FIG. 2, for k=3 (Eq. 5), and the graph used to generate binary sequences with a spectral null at Nyquist frequency $(f_N)$ is shown in FIG. 3, for m=3 (Eq. 6). These canonical diagrams can be used as the basis to develop a code for translating arbitrary binary sequences or data words into new binary sequences or code words that can later be converted into a modulated sequence with a spectral null at Nyquist frequency.

Graph Capacity

If N represents the number of states in the canonical diagram, the capacity (C) of the graph is given by the following:

$$C = 1 + \log_2 \cos\left( \frac{\pi}{N+1} \right) \quad (7)$$

For example, for the graphs of FIGS. 2 and 3, N=4. From Eq. 7 above, the graph capacity (C) is approximately 0.6942. The capacity of either graph can be increased by increasing the number of states (N) while preserving the labelling scheme.

Figure 4:
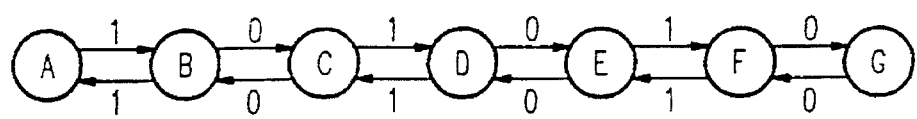
FIG. 4 is a seven-state canonical state diagram for binary sequences having a spectral null at Nyquist frequency, for use in developing a rate 8/10 code.

The graph capacity (C) is the upper limit to the achievable code rate (R) of a code which can be designed from that graph. In other words, to construct a code to translate 8-bit data words to 10-bit code words, i.e., R=8/10, the starting graph must be a canonical state diagram having a Nyquist null labelling scheme, with a number of states (N) where the graph capacity (per Eq. 7) is at least 0.8. A 6-state Nyquist null graph has a graph capacity (per Eq. 7) of approximately 0.8495. A 7-state Nyquist null graph has a graph capacity of about 0.8857. Although both the 6-state and 7-state graphs in theory have sufficient capacity to proceed with the code design, the 7-state graph of FIG. 4 is chosen in the preferred embodiment and is described as follows, since it affords greater convenience and flexibility in designing a code which is both phase invariant and non-quasicatastrophic.

Graph Power And Period

The $n^{th}$ power of the graph is a graph whose states are the same as the original graph, but in which the label on an edge or path between any pair of states is the sequence of n symbols read off the edges of the path joining those states in the original graph. For example, the 7-state graph of FIG. 4 yields a 3-state subgraph (G) as depicted in FIG. 5, wherein the subgraph (G) represents the second power of the original 7-state graph (FIG. 4).

A loop in the graph is a path that begins and ends at the same state. A loop that does not pass through any other state is referred to as a self-loop. The graph is irreducible if there is a path of some length between every pair of states in the graph. An irreducible graph is said to be periodic with a period (p) if the length of every loop in the graph is a multiple of (p), with p>1. The pth power of a periodic graph with period (p) subdivides itself into (p) disconnected aperiodic graphs.

Figure 5:
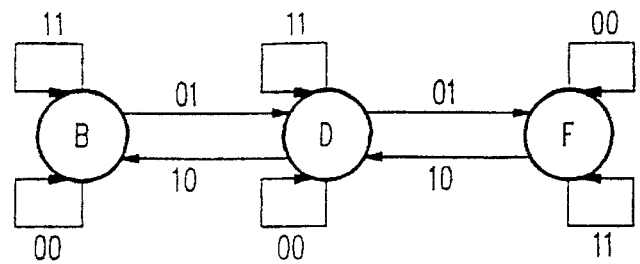
FIG. 5 is the three-state subgraph (G) of the second power of the seven-state diagram of FIG. 4.

The period of the 7-state Nyquist null graph of FIG. 4 equals 2, as can be verified by taking its second power (FIG. 5). The second power splits into two graphs, one consisting of states B, D and F (FIG. 5) and the other consisting of states A, C, E and G. As previously described, FIG. 5 shows the 3-state subgraph of the second power, including states B, D and F.

Non-Quasicastastrophic

In a canonical graph, a loop is referred to as quasi-catastrophic if its label is the same in binary code as the label on any other loop. For example, in FIG. 5, the self-loops "11" around states B, D and F are identical, whereby these loops are quasicatastrophic. Similarly, the self-loops "00" for these states are also identical and are thus quasi-catastrophic. Moreover, the loops B-D-B and D-F-D are quasicatastrophic since their labels are the same, namely, "0110". If any loop is quasicatastrophic, the graph is referred to as a quasicatastrophic graph. Conversely, if no loop is quasicatastrophic, then the graph is referred to as non-quasicatastrophic.

Adajcency Matrix

The adjacency matrix (A) of a graph with (m) states is a (m)×(m) matrix in which A (i, j)=0 if there is no edge between the states (i) and (j), and A (i, j)=r if there are (r) edges between states (i) and (j). For example, for subgraph (G) of FIG. 5, the adjacency matrix is represented as follows:

$$A = \begin{matrix} & B & D & F \\ B & \begin{bmatrix} 2 & 1 & 0 \\ D & 1 & 2 & 1 \\ F & 0 & 1 & 2 \end{bmatrix} \end{matrix} \quad (8)$$

If (A) is the adjacency matrix for a graph, then $A^n$ is the adjacency matrix for the $n^{th}$ power of the graph.

Deterministic Graph

A graph is deterministic if, for every state in the graph, the edges leaving that state have distinct labels. The $n^{th}$ power of the deterministic graph is also deterministic. For example, the subgraph G (FIG. 5) is deterministic.

Matched Spectral Null Code Theorem

For a partial response channel, having a transfer function of the form $(1-D)(1+D)^n$, where n=0, 1, 2, 3, that is operating in additive white Gaussian noise (AWGN), use of a code having a null in its power spectrum at the frequency at which the channel has a higher order null will result in a gain in signal-to-noise ratio (SNR) at the output of the encoded channel. This gain is lower bounded by 10 log [(n+1)n] dB if n>0, and by 3 dB if n=0, provided that the uncoded and encoded channels operate at the same transmission rate.

The partial response channels are commonly referred to as the dicode channel, the PR4 channel, the EPR4 channel, and the $E^2PR4$ channel, respectively.

A Rate 8/10 Nyquist Null Code

The code design process for a rate (R)=8/10 code is started, as previously described, from the 7-state Nyquist-null canonical diagram of FIG. 4, since that graph has a capacity (C) greater than 0.8. The 7-state state graph of FIG. 4 is then converted to the second power diagram (G) of FIG. 5. This second power, 3-state subgraph (G) forms the foundation for the code design procedure.

The second power subgraph (G) is raised to its fifth power to construct a rate 8/10 code (i.e., 2×5=10). The adjacency matrix for the resultant subgraph ($G^5$) is:

$$A^5 = \begin{matrix} & B & D & F \\ B & \begin{bmatrix} 132 & 164 & 100 \\ D & 164 & 232 & 164 \\ F & 100 & 164 & 132 \end{bmatrix} \end{matrix} \quad (9)$$

Since there are more than 256 edges with 10 bit labels leaving each state of the subgraph ($G^5$), there is an excess number of candidate 10-bit code words to construct a rate 8/10 code. In this regard, the requisite number of 10-bit code words is $2^8$=256 possible 8-bit data word combinations. The code word selection process proceeds by arbitrarily removing, i.e., not selecting those code words that would be incompatible with desired non-quasicatastrophic and phase invariant characteristics.

Phase Invariant And Non-Quasicatastropic Code

A code is phase invariant if and only if:

(1) For each code word, its complement is also a code word, and (2) The decoder interprets or decodes each code word and its complement to the same data word.

A code is non-quasicatastrophic if and only if;

(1) No loop in the code graph is quasicatastrophic, and (2) No loop in the code graph is a quasicatastrophic loop in (G) and ($G^5$).

Code Construction For A Rate 8/10 Code

Figure 6:
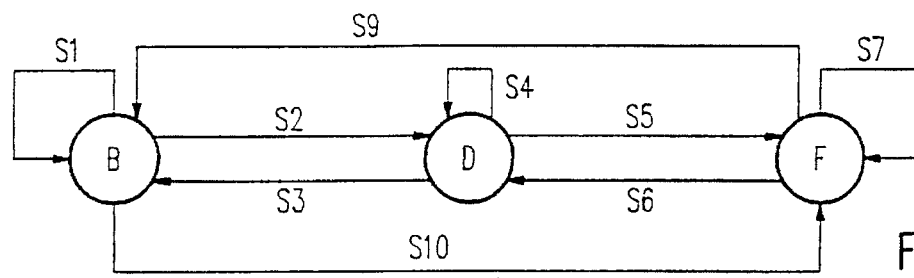
FIG. 6 is a state diagram ($G^5$) representing the fifth power of the three-state subgraph (G) of FIG. 5.

FIG. 6 is a reproduction of the subgraph ($G^5$) of FIG. 5, with edge labels rewritten to indicate the set of edges joining each pair of states. For example, S1 denotes the set of 132 10-bit labelled edges that begin and end at state B. The number of 10-bit labelled edges comprising the sets referred to by S1, S2 ... S10 are given by the adjacency matrix $A^5$ (Eq. 9).

The subgraph ($G^5$) as well as the final code graph to be developed can be viewed as being compiled in increments from the subgraph of (G) that progressively increase in complexity. Correspondingly, the adjacency matrix $A^5$ (Eq. 9) can also be viewed as being incrementally generated.

Figure 7:
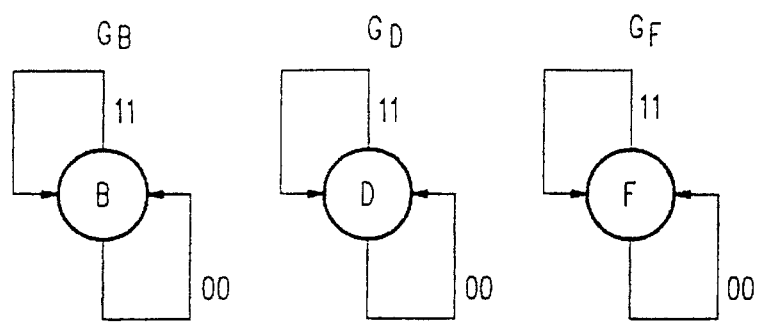
FIG. 7 is a trio of subgraphs ($G_B$), ($G_D$) and ($G_F$) respectively representing isolated portions of the three-state subgraph (G)

More specifically, FIG. 7 illustrates the subgraph (G) in partial form as three 1-state subgraphs $G_B$, $G_D$, and $G_F$. Each of these three 1-state subgraphs has 32 different self-loops on each state in ($G^5$). These 1-state subgraphs do not generate any other paths in ($G^5$). Let $M_1$ denote the contribution to the adjacency matrix $A^5$ by these 1-state graphs:

$$M_1 = \begin{matrix} & B & D & F \\ B & 32 & 0 & 0 \\ D & 0 & 32 & 0 \\ F & 0 & 0 & 32 \end{matrix} \quad (10)$$

Since the labels on the loops for states B, D and F are the same, these 32 loops are quasicatastrophic in ($G^5$) and are therefore avoided in the final code.

Figure 8:
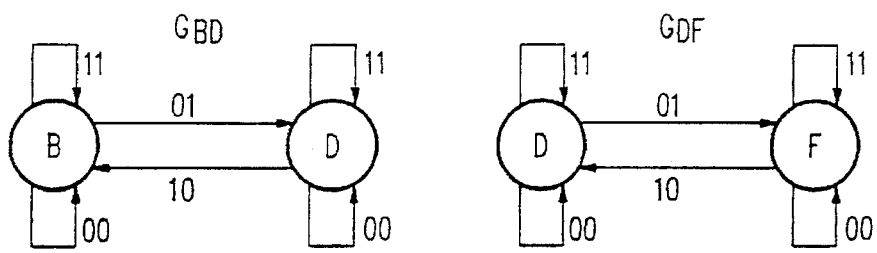
FIG. 8 is a pair of subgraphs ($G_{BD}$) and ($G_{DF}$) representing additional portions of the three-state subgraph (G)

The next step in the interconnection complexity between the states in the subgraph (G) is viewed, wherein this subgraph constitutes independent 2-state graphs $G_{BD}$ and $G_{DF}$ as viewed in FIG. 8. Note that there is no direct connection shown between states B and F.

Note that the subgraphs $G_{BD}$ and $G_{DF}$ are identical. As a result, the adjacency matrix N for each subgraph will also be identical. For example, the adjacency matrix of $G_{BD}$ is:

$$N = \begin{matrix} & B & D \\ B & 2 & 1 \\ D & 1 & 2 \end{matrix} \quad (11)$$

$$N^5 = \begin{matrix} & B & D \\ B & 122 & 121 \\ D & 121 & 122 \end{matrix} \quad (12)$$

From the adjacency matrix $N^5$, it is noted that 122 self-loops are generated around B in ($G^5$) by $G_{BD}$. Mowever, from Eq. (10), 32 of those self-loops are formed by B alone. Therefore, by connecting state D to state B to form $G_{BD}$, an additional 90 self-loops (122–32) around B are present in ($G^5$). Moreover, since $G_{BD}$ and $G_{DF}$ are identical, those same 90 self-loops are also generated around D in ($G^5$) by GDF. Accordingly, these two sets of 90 self-loops are thus quasicatstrophic in ($G^5$), and thus cannot both be included in the final code. One set of these 90 self-loops can be included. The selected set is shown with respect to state D in FIG. 9, and is identified by $S_{DD}$.

Figure 9:
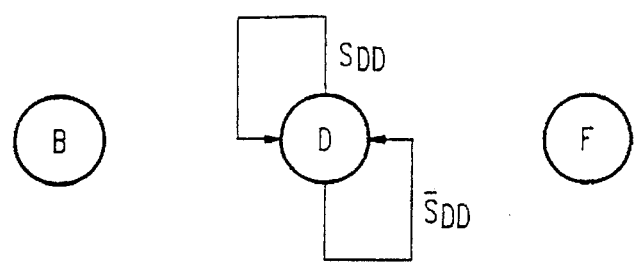
FIGS. 9-12 represent the code graph at progressive stages of development.

The adjacency matrix $N^5$ also indicates that there are 122 self-loops formed around D in ($G^5$) by $G_{BD}$. However, as noted in Eq. (10), 32 of those self-loops are already defined by D alone, such that the interconnection between B and D resulted in 90 additional self-loops around D. Notably, those 90 additional self-loops around D are the complements of the set referenced above by $S_{DD}$, and hence are noted in FIG. 9 by $\bar{S}_{DD}$. Since $G_{BD}$ and $G_{DG}$ are identical, these 90 additional self-loops are also generated around F in ($G^5$) by $G_{DF}$, and are thus quasicatastrophic if both sets are included in the final code. FIG. 9 indicates selection of the set $S_{DD}$ around state D, but not the corresponding set around state F. FIG. 9 thus represents a partial graph of the final code, to include $S_{DD}$ and its complement set $\bar{S}_{DD}$.

Figure 10:
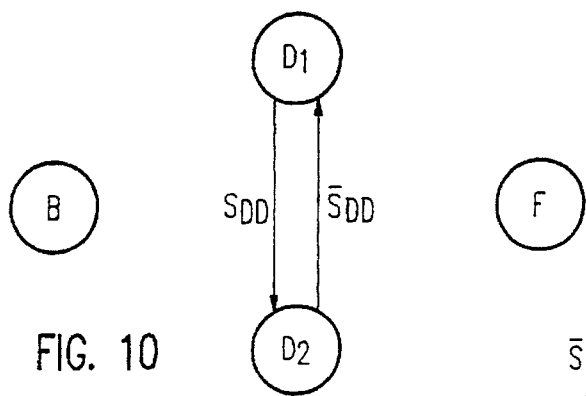

FIG. 10 illustrates modification of the partial graph of FIG. 9, by splitting state D into two states $D_1$, and $D_2$. By splitting state D, new loops $D_1$-$D_2$-$D_1$ and $D_2$-$D_1$-$D_2$ result, wherein these loops are non-quasicatastrophic in FIG. 10 and in (G).

From the adjacency matrix $N^5$ (Eq. 12), it is noted that $G_{BD}$ generates 121 paths from state B to state D in ($G^5$). By symmetry, $G_{DF}$ also generates 121 paths in ($G^5$), with the same labels as the paths between states B and D. Similarly, $G_{BD}$ generates another set of 121 labels for paths from state D to state B, wherein the set in this direction are complements to the set from state B to D. The set of paths from B to D are referred to as $G_{BD}$, and the complement set from D to B is referred to a $\bar{S}_{BD}$. The same analysis applies to the 121 pathes from state D to state F, referred to $S_{DF}$, and the complement set of paths from state F to D, referred to $\bar{S}_{DF}$. The set of paths $S_{BD}$ and $S_{DF}$ are the same, and thus we denote $S_{DF}$ as $S_{BD}$.

Figure 11:
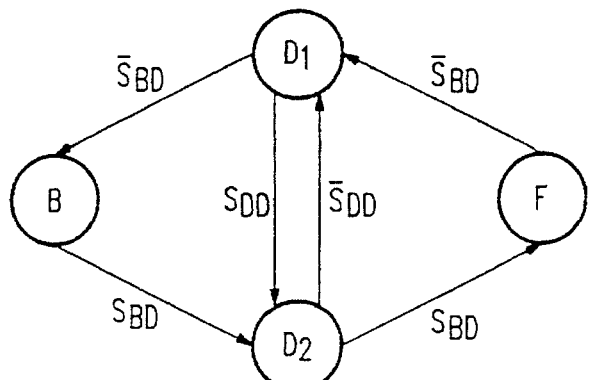

Therefore, in FIG. 10, if the labelled edges in $S_{BD}$ extend from B to $D_1$, and the edges $\bar{S}_{BD}$ extend from $D_2$ to B, then the resultant B-$D_1$-$D_2$-B loops would be the same as the B-D-D-B loops in ($G^5$) that were generated by $G_{BD}$. Similarly, if the edges in $S_{BD}$ extend back to B from the same state ($D_1$ or $D_2$) to which the edges $S_{BD}$ come from B, then the loop B-$D_1$-B or B-$D_2$-B would be the same as the B-D-B in ($G^5$) generated by $G_{BD}$. Both B-D-B and B-D-D-B loops quasicatastrophic in (G) and thus the code graph should avoid them. Hence, in FIG. 10, the edges in $S_{BD}$ should extend from B to $D_2$, and the edges in $\bar{S}_{BD}$ should extend from $D_1$ to B. By the same reasoning, the edges in $\bar{S}_{BD}$ should extend from $D_2$ to F, and the edges in $S_{BD}$ should extend from F to $D_1$. The code graph reflecting these edges, inclusive of the edges selected per FIG. 9, is shown in FIG. 11.

To this point, the contribution $M_2$ of the 2-state subgraphs $G_{BD}$ and $G_{DF}$ to the adjacency matrix $A^5$ is as follows:

$$M_2 = \begin{matrix} & B & D & F \\ B & 90 & 121 & 0 \\ D & 121 & 180 & 121 \\ F & 0 & 121 & 90 \end{matrix} \quad (13)$$

The next step in sequence in terms of increased interconnection complexity of the subgraph (G) involves examination of the independent 3-state graph defined by the subgraph (G). The contribution $M_3$ made by this 3-state graph to the adjacency matrix $A^5$ is given by:

$$M_3 = A^5 - (M_1 + M_2) \quad (14)$$

from which the following is derived:

$$M_3 = \begin{matrix} & B & D & F \\ B & 10 & 43 & 100 \\ D & 43 & 20 & 43 \\ F & 100 & 43 & 90 \end{matrix} \quad (15)$$

All of the loops in ($G^5$) that are produced by (G) will be non-quasicatastrophic in ($G^5$). Hence, these loops can be included in the final code, up to a number providing 256 edges leaving each state in the code graph.

The twenty additional self-loops around state D in ($G^5$) formed by (G) can be evenly distributed between $D_1$ and $D_2$, with ten edges leaving $D_1$ and the other ten edges leaving $D_2$. These two sets of ten edges are complements to each other, and are denoted in FIG. 12 by $S_{DDG}$ and $\bar{S}_{DDG}$.

Figure 12:
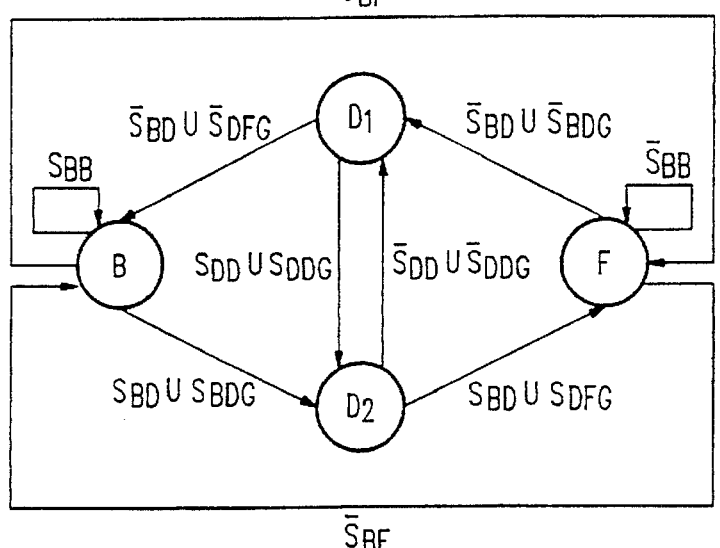

The set of 43 edges generated by (G) that extend from state B to state D in ($G^5$) is referred to in FIG. 12 by $S_{BDG}$. Similarly, the set of 43 edges generated by (G) and extend from state D to state F in ($G^5$) are designated $S_{DFG}$. The complement set of 43 edges generated by (G) to extend from state F to state D in ($G^5$) are labelled $\bar{S}_{BDG}$, and the complement set of 43 edges generated by (G) to extend from state D to state B in ($G^5$) are labelled $\bar{S}_{DFG}$.

In ($G^5$), the graph (G) also generates 10 self-loops on state B, denoted in FIG. 12 by $S_{BB}$, and 10 complement self-loops around state F, labelled $\bar{S}_{BB}$ in FIG. 12.

Finally, the graph (G) generates 100 edges extending from state B to state F in ($G^5$), identified in FIG. 12 by $S_{BF}$. Another 100 edges are generated to extend from state F to state B in ($G^5$), wherein this set is a complement to $S_{BF}$, and is thus noted in FIG. 12 as $\overline{S}_{BF}$.

The code graph is shown in FIG. 12, which includes a composite of FIGS. 10–11. In this graph (FIG. 12), the edges $S_{BDG}$ are shown to extend from state B to $D_2$, and the edges $S_{DFG}$ are shown to extend from state $D_1$ to B. The symbol "U" on the code graph (FIG. 12) denotes the union of sets. For example, the notation $S_{BD}$ U $S_{BDG}$ on the edge connecting state B and $D_2$ refers to all of the edges in the union of sets $S_{BD}$ and $S_{BDG}$ that extend from state B to $D_2$.

The complexity of the code graph can be reduced by omitting self-loops on states D and F. In addition, for a rate 8/10 code, to arrive at the requisite 256 code words, 8 additional edges can be eliminated, for example, from $S_{BD}$ and the complements thereof in $\overline{S}_{BD}$. This permits all of the edges in the sets $S_{BDG}$ and $S_{DFG}$ to be utilized, a choice that aids in reducing the detection memory required to implement the code.

In this regard, given a stream of 10-bit code words, it is desirable to detect the path in the code graph that would have generated the code word. If the code graph path for each code word can be identified from the code word itself, without reference to knowledge of the preceding code word, then the detection memory of the code graph is said to be zero.

If a code word defined by a particular 10-bit pattern or sequence is the label for an edge in the set $S_{BDG}$, then the path in the code graph is identified as between the states $D_2$ and F. However, if the 10-bit pattern is the label for an edge in the set $S_{BD}$, it is not possible to specify whether that pattern represents a code graph path between the states B and $D_2$ or between the states $D_2$ and F, unless the preceding code word is known. That is, if the preceding code word is the label for an edge in the set $\overline{S}_{DF}$ or $\overline{S}_{BD}$ or $\overline{S}_{DFG}$, then the current code word represents an edge between states B and $D_2$. However, if the prior code word is from the sets $S_{BD}$, $S_{DD}$ or $S_{BDG}$, the current code word represents an edge between the states $D_2$ and F. Omission of the 8 edges from $S_{BD}$ and $\overline{S}_{BD}$ avoids the need to know the prior code word in the stream, to thus simplify detection memory.

The set of all 256 possible 8-bit data words are assigned to individual 10-bit code words, following the rule that any given 10-bit code word and its complement must decode to the same 8-bit data word. The resultant code is thus made phase invariant.

Figure 13:
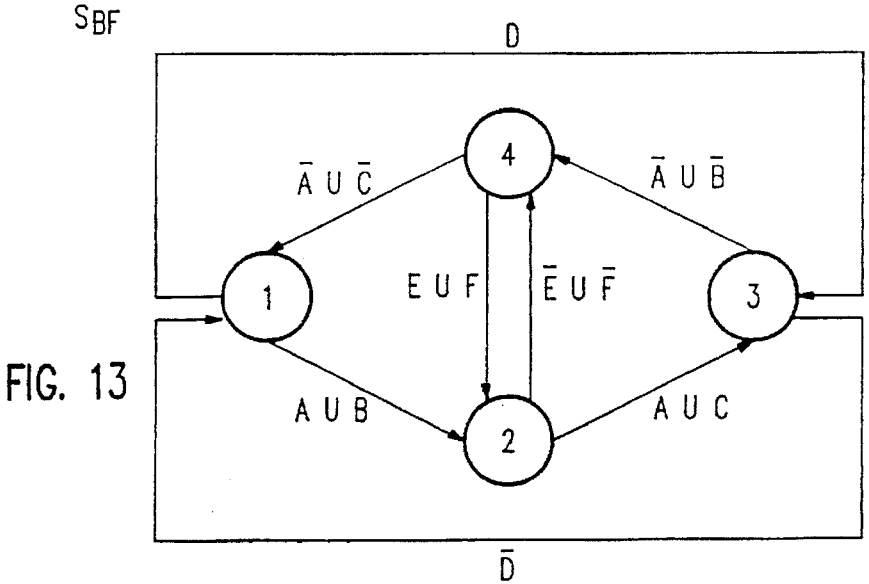
FIG. 13 represents the final code graph.

The final code graph is shown in FIG. 13, wherein the states B, $D_1$, $D_2$, and F have been re-labelled as 1, 2, 3 and 4, and wherein the sets of edge labels representing 10-bit code words $S_{BD}$, $S_{BDG}$, $S_{DFG}$, $S_{BF}$, $S_{DD}$ and $S_{DDG}$ have been re-labelled as A, B, C, D, E and F. Similarly, the complement sets have been re-labelled $\overline{A}$, $\overline{B}$, $\overline{C}$, $\overline{D}$, $\overline{E}$, and $\overline{F}$. The code represented by FIG. 13 is block decodable.

Figure 14:
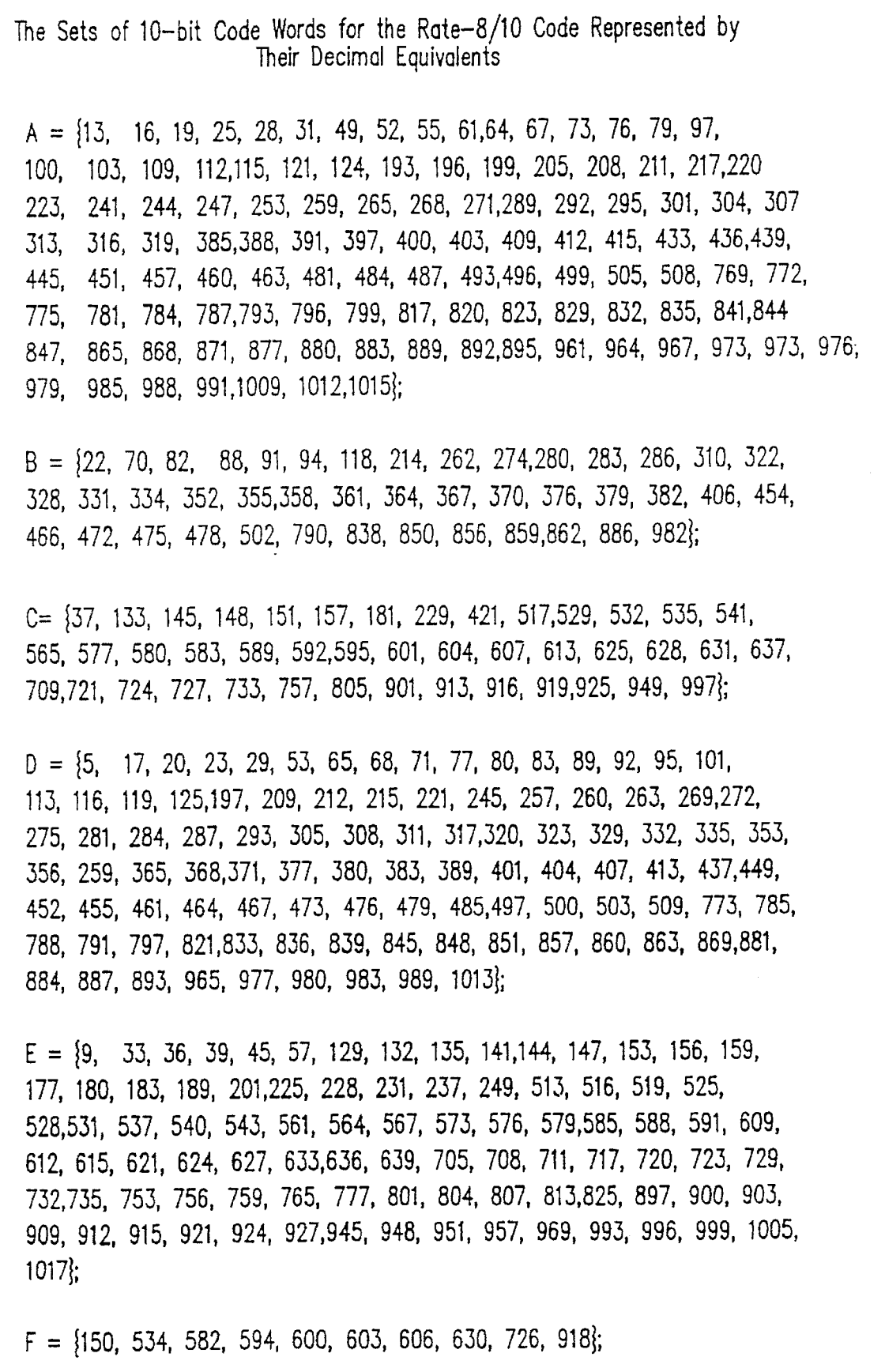

FIG. 14 is a table wherein the sets of 10-bit code words are listed by decimal equivalent in association with the six re-labelled sets A through F (FIG. 13).

FIG. 15 is an encoder table representing the operation of a standard 4-state block encoder 10 in FIG. 1 to assign a unique 10-bit code word to each unique 8-bit string of binary data. FIG. 16 is a decoder table representing the operation of a decoder for decoding the code words and their complements to retrieve the original data in the form of successive 8-bit strings.

When a Viterbi detector is used to demodulate the code words at the output of the partial response system, the SNR gain achieved by use of the matched spectral-null code can be used to improve performance. Mowever, in practice, to realize this benefit, the detector must only use a finite memory, wherein the trellis of such detector is referred to as a finite-memory trellis. Another practical constraint is that the complexity of the trellis should not be too great in terms of the total number of states and edges.

The present invention thus provides a matched spectral null code for partial response channels, and a related method of code construction, wherein the code is non-quasicatastrophic and phase invariant, and further wherein the code is applicable to higher order partial response channels with n=1, 2, 3. Although a specific rate 8/10 code has been described in detail, it will be understood that the same methodology can be used to develop other matched spectral null codes at other code rates, such as 3/4, 6/8, etc. Accordingly, it will be understood that the invention is not limited to the embodiment shown and described herein, except as set forth in the appended claims.

What is claimed is:

1. A method of coding an input string of data for a partial response channel having a transfer function of the form $(1-D)(1+D)^n$ to provide an output having a preselected code rate, said method comprising the steps of;

determining the frequency at which there is a higher order null in the transfer function of the partial response channel, wherein $n \geq 1$; and encoding an input string of data into a binary code string having a power spectrum value of zero for such frequency;

said encoding step including encoding each unique data word to a corresponding unique code word in accordance with a phase invariant and non-quasicatastrophic encoding table.

2. The method of claim 1 wherein said encoding step comprises subdividing the input string of data into a succession of data words of selected uniform length and translating said data words respectively to code words of selected uniform length, wherein each data word translates to a code word.

3. The method of claim 2 further including the step of decoding said code words to recreate said input string of data, said decoding step comprising translating each unique code word and the complement thereof to said data word associated therewith.

4. The method of claim 2 wherein said encoding step comprises generating an encoding table from canonical state diagrams (G) and ($G^p$) for binary sequences having spectral nulls at Nyquist frequency, wherein the power (p) of the diagram ($G^p$) is a function of code word length, and further wherein a selected code word that forms a loop in the diagrams (G) and ($G^p$) corresponds with a loop that is non-quasicatastrophic in the diagram (G).

5. A method of coding an input string of data for a partial response channel having a transfer function of the form $(1-D)(1+D)^n$ to provide an output having a preselected code rate, said method comprising the steps of:

subdividing the input string of data into a succession of data words of selected uniform length wherein the number of unique data words is a function of said selected data word length;

translating said data words to code words of selected uniform length greater than said selected data word length, by generating an encoding table from canonical state diagrams (G) and ($G^p$) for binary sequences having spectral nulls at Nyquist frequency, wherein the power (p) of the diagram ($G^p$) is a function of code word length, wherein for each code word selected the complement thereof is also selected, wherein a selected code word that forms a loop in the diagrams (G) and ($G^p$) corresponds with a loop that is non-quasicatastrophic in the diagram (G), and wherein each selected code word and its complement are decoded to the same unique data word.

6. The method of claim 5 wherein the canonical state diagram (G) has a number of states sufficient to yield a graph capacity (C) which exceeds the ratio of said selected data word length to said selected code word length, wherein the graph capacity (C) is given by the formula:

$$C = 1 + \log_2 \cos\left(\frac{\pi}{N+1}\right)$$

7. The method of claim 5 further including the step of decoding each unique code word and its complement to the same unique data word to recreate said input string of data.

8. A system for encoding and decoding an input string of data for a partial response channel having a transfer function of the form $(1-D)(1+D)^n$ to provide an output having a preselected code rate, said system comprising:

finite storage means for storing an encoding table for translating a succession of input data words of selected uniform length to a succession of output code words of selected uniform length greater than said selected data word length, wherein each unique data word translates to a unique code word;

said encoding table being generated from canonical state diagrams (G) and ($G^p$) for binary sequences having spectral nulls at Nyquist frequency, wherein the power (p) of the diagram ($G^p$) is a function of code word length, and further wherein a selected code word that forms a loop in the diagrams (G) and ($G^p$) corresponds with a loop that is non-quasicatastrophic in the diagram (G); and decoder means for decoding each unique code word and the complement thereof to the unique data word associated therewith.

* * * * *